United States Patent
Takahashi (10) Patent No.: US 6,549,573 B2
(45) Date of Patent: *Apr. 15, 2003

(54) TESTING METHOD AND APPARATUS OF GLITCH NOISE AND STORAGE MEDIUM

(75) Inventor: Kazuya Takahashi, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,193

(22) Filed: Dec. 18, 1998

(65) Prior Publication Data

US 2003/0002573 A1 Jan. 2, 2003

(30) Foreign Application Priority Data

Dec. 26, 1997 (JP) .............................. 9-361532

(51) Int. Cl.[7] .............................................. H04B 17/00
(52) U.S. Cl. ..................................................... 375/227
(58) Field of Search ................................. 375/224, 227, 375/341

(56) References Cited

U.S. PATENT DOCUMENTS 5,581,568 A * 12/1996 Togami ...................... 714/795

* cited by examiner

Primary Examiner—Chi Pham
Assistant Examiner—Kevin M Burd
(74) Attorney, Agent, or Firm—Fitzpatrick, Cella, Harper & Scinto (57) ABSTRACT

An A/D converter executes an A/D conversion of an inputted signal having a ramp waveform in response to a clock signal and sequentially stores digital output data into memories. In response to the clock signal, the storage data is read out from the memories. In a calculator, from certain data, data whose phase is delayed by one clock from such data is subtracted and a peak value of a subtraction value is detected by a peak detector. When the peak value lies within a range of ±1, it is determined that no glitch noise occurs. When the peak value exceeds the range of ±1, it is decided that the glitch noise has occurred.

15 Claims, 7 Drawing Sheets

SHIFT DATA BY 1 CLOCK

FIG. 7B
PRIOR ART

TESTING METHOD AND APPARATUS OF GLITCH NOISE AND STORAGE MEDIUM

BACKGROUND OF THE INVENTION

1. Field of the Invention

The present invention relates to a method of testing an A/D converter, a storage medium storing a program to test an A/D converter, and an apparatus for testing an A/D converter for glitch noise.

2. Related Background Art

Figure 6A:
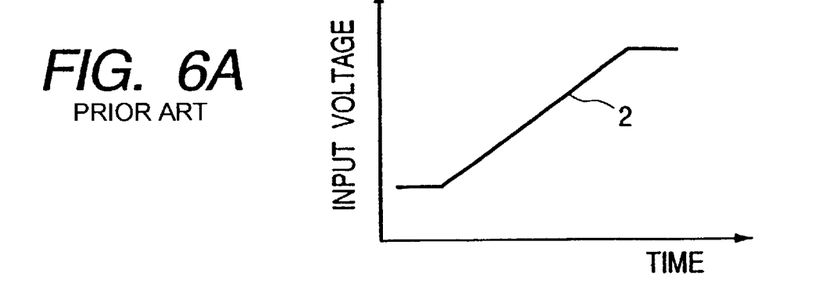
FIGS. 6A, 6B, 6C and 6D are diagrams for explaining a DNL test according to a conventional histogram method.
Figure 6B:
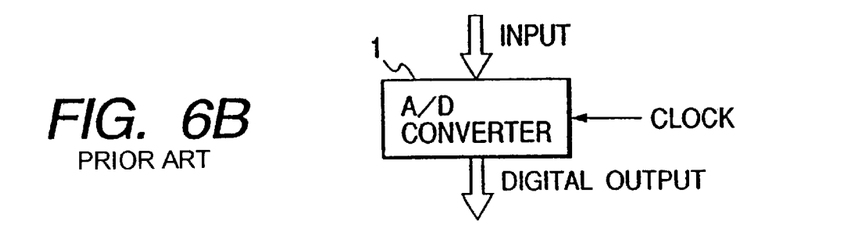
Figure 6C:
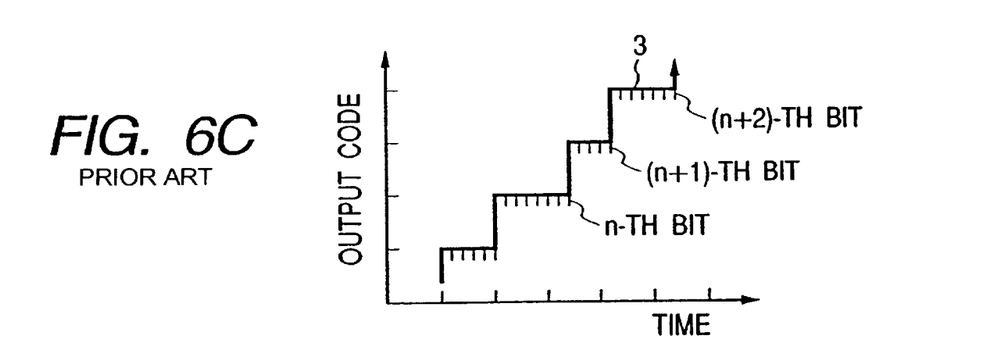
Figure 6D:
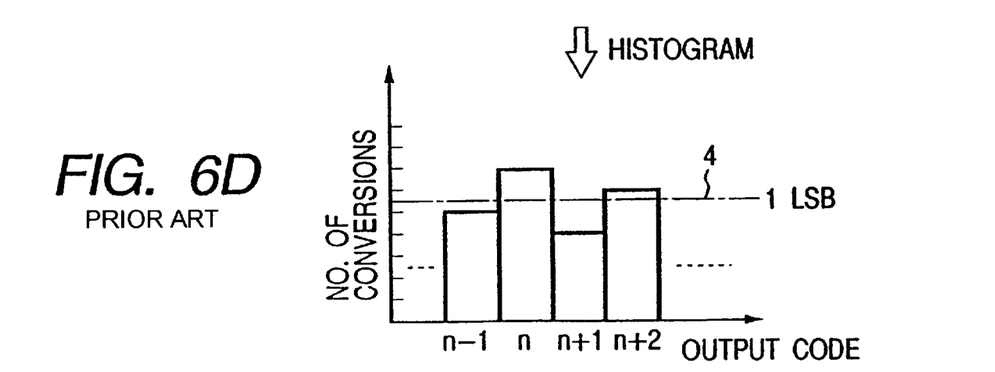

A differential non-linearity (hereinafter, abbreviated to DNL) is used as a representative value showing converting characteristics of an A/D converter. At present, there is a histogram method as a general DNL testing method. According to the histogram method, as shown in FIG. 6B, a signal having a ramp waveform 2 of FIG. 6A is inputted to an input terminal of an A/D converter 1 and an A/D conversion is performed at a clock frequency which is fairly higher than that of the input ramp waveform. Each code of converted digital output data 3 is as shown in FIG. 6C. The number of times of generation of each code converted by a clock corresponds to the DNL between the conversion bits. Therefore, as shown in FIG. 6D, a histogram in which an axis of abscissa shows a digital output code and an axis of ordinate indicates the number of conversions is obtained. As shown in FIG. 6D, a mean value 4 of the numbers of conversions of all of the digital output codes corresponds to 1 LSB of the A/D converter 1. The value having the largest difference among the numbers of conversions of the codes for the mean value 4 is set to the DNL of the A/D converter. The histogram method has an advantage such that even if random noises are mixed into an input signal or the like upon testing, by getting the mean value of the histograms due to the repetition of a few times, the noises can be reduced and a DNL test can be performed at relatively high precision.

Figure 7A:
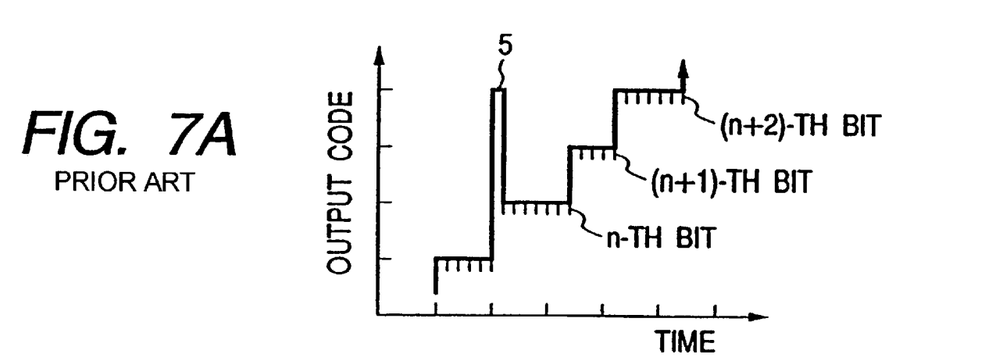
FIGS. 7A and 7B are diagrams showing a problem in the conventional histogram method.
Figure 7B:
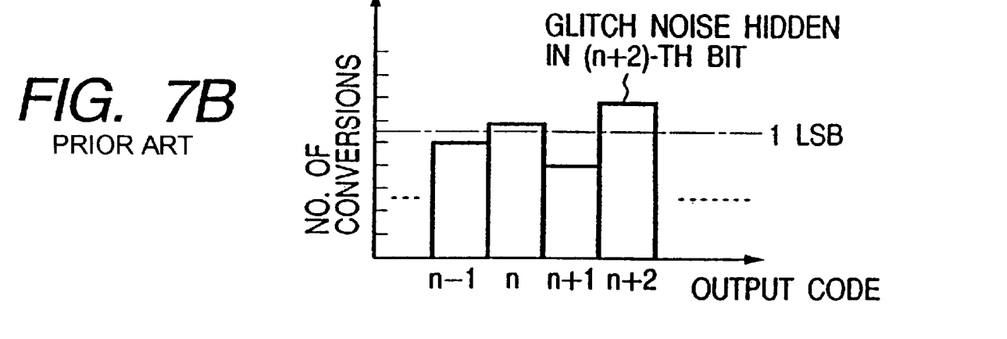

However, such a histogram method has the following problem. As shown in FIG. 7A, in an A/D converter for generating a glitch noise 5 in output data, the glitch noise of the n-th bit is hidden in the digital output code of the (n+2)-th bit, as shown in FIG. 7B. Therefore, it is difficult to find a defect.

There is also a drawback such that in the case where the standard of the DNL of the A/D converter is equal to or less than −1 LSB, a defect in which monotonousness (data changes one bit by one in a manner such that the (n+1)-th bit appears after the n-th bit) is missing occurs, for example, in the case where the (n+2)-th bit comes after the n-th bit, the histogram data of the (n+1)-th bit is equal to 0, the DNL of the (n+1)-th bit is equal to (0−1 LSB)=−1 LSB, and the monotonousness of the A/D converter cannot be guaranteed.

SUMMARY OF THE INVENTION

It is, therefore, an object of the invention to solve the foregoing problems and to provide a method of testing an A/D converter, a storage medium storing a program to test an A/D converter, and an apparatus for testing an A/D converter for glitch noise.

To accomplish the above object, according to the invention, a signal of a ramp waveform is inputted to an A/D converter, a difference between a digital output code outputted from the A/D converter and another digital output code obtained by shifting the output code by predetermined clocks is obtained, and a glitch is detected on the basis of a peak value of such a difference.

Preferably, the predetermined clocks are one clock.

Preferably, when the peak value of the difference exceeds a range of ±1, it is determined that the glitch has occurred.

Preferably, when an amplitude of the peak value of the difference exceeding the range of ±1 on the plus (+) side does not coincide with that on the minus (−) side, it is decided that a glitch noise has occurred at a change point of the relevant bit of the output code. When those amplitudes coincide, it is determined that the glitch noise has occurred in a flat portion of the relevant bit of the output code.

Preferably, a testing apparatus of a glitch noise of the invention comprises: means for inputting a signal having a ramp waveform to an A/D converter; two memory means for storing digital output data from the A/D converter; means for calculating a difference between the output data read out from one of the memory means in response to a clock and the output data read out from the other memory means in response to a clock obtained by shifting by predetermined clocks; and means for detecting a glitch on the basis of a peak value of the difference obtained by the calculation.

Preferably, a testing apparatus of a glitch noise of the invention comprises: means for inputting a signal having a ramp waveform to an A/D converter; two arrays each for storing digital output data from the A/D converter by shifting by predetermined clocks; means for calculating a difference between the output data which was read out from the two arrays and shifted by the predetermined clocks; and means for detecting a glitch on the basis of a peak value of the difference obtained by the calculation.

Preferably, there is provided a storage medium in which a detecting program for detecting a glitch noise of an A/D converter to which a signal having a ramp waveform was inputted has been stored, wherein the detecting program allows a computer to: store digital output data from the A/D converter into two arrays so as to be shifted by predetermined clocks; calculate a difference between the output data which was read out from the two arrays and was shifted by the predetermined clocks; and detect a glitch on the basis of a peak value of the difference obtained by the calculation.

According to the invention, the glitch noise which cannot be detected by only the histogram method can be detected at high precision. Further, an amplitude of the glitch noise, a generating position, and a generating position (whether it is a change position of bits or a flat portion) on the relevant bit can be known.

The above and other objects and features of the present invention will become apparent from the following detailed description and the appended claims with reference to the accompanying drawings.

DETAILED DESCRIPTION OF THE PREFERRED EMBODIMENTS

A preferred embodiment of the invention will now be described hereinbelow with reference to the drawings. Since the method of recognizing converting characteristics of an A/D converter of the present invention is similar to the method described in the related art, its description is omitted here. A method of testing for a glitch noise will now be explained.

Figure 1A:
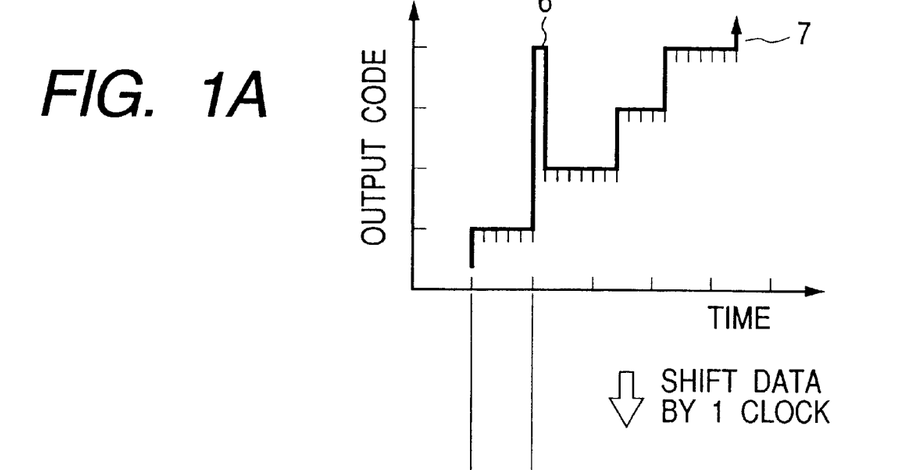
FIGS. 1A, 1B and 1C are explanatory diagrams of a testing method of a glitch noise according to the invention.
Figure 1B:
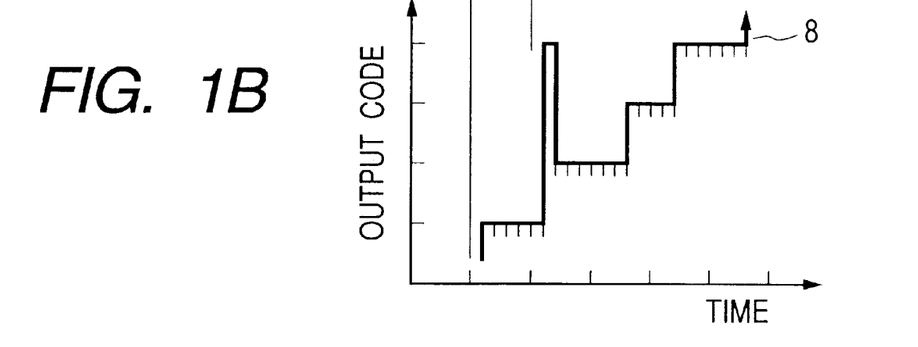
Figure 1C:
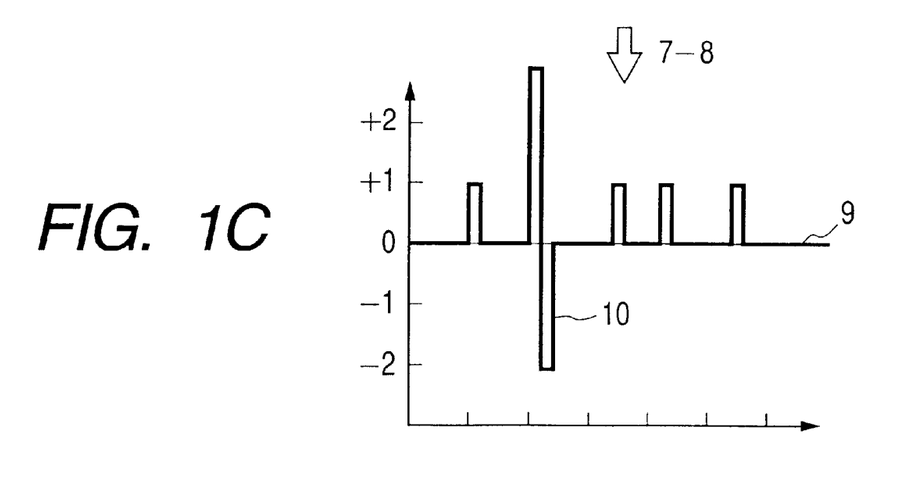

FIGS. 1A to 1C are explanatory diagrams of an embodiment of the invention. FIG. 1A shows digital output data 7 including a glitch noise 6 after completion of the A/D conversion. The output data is shifted by one clock (to the right) as shown in FIG. 1B. Resultant data 9 is obtained by subtracting output data 8 shown in FIG. 1B from the output data 7 shown in FIG. 1A. The resultant data 9 obtained by this subtraction is shown in FIG. 1C. As illustrated, portion 10 corresponding to the glitch noise appears distinct compared with the other portions. The amplitude of the portion 10 shows an amplitude of the glitch noise. By detecting (measuring) to which number of clocks from the start of the A/D conversion the amplitude corresponds, the position in the relevant bit of the output code in which the defect occurred can be tested.

Figure 2A:
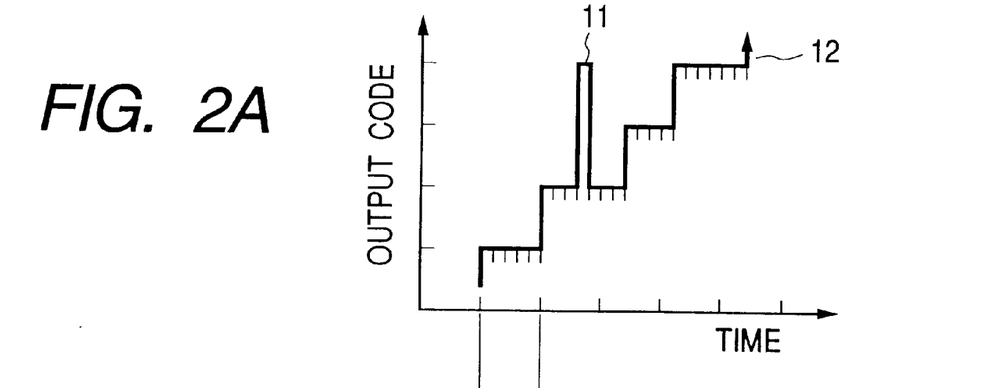
FIGS. 2A, 2B and 2C are another explanatory diagrams of a testing method of a glitch noise according to the invention.
Figure 2B:
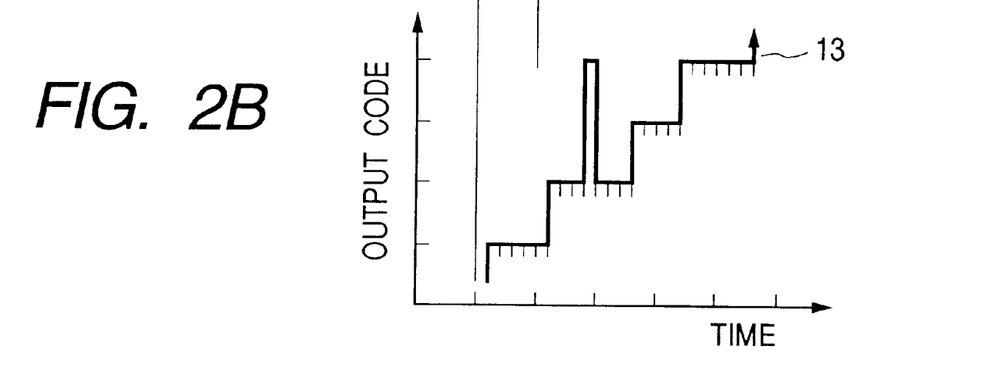
Figure 2C:
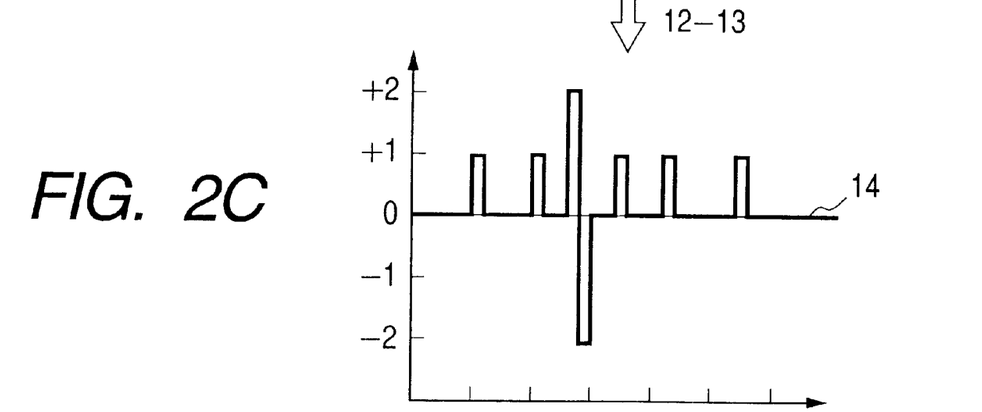

If the glitch noise occurs at a change position from the n-th bit to the (n+1)-th bit, the amplitude of the portion corresponding to the glitch noise on the plus (+) side does not coincide with that on the minus (−) side (FIG. 1C). As shown in FIG. 2C, if a glitch noise 11 occurs at a flat portion of the relevant bit of digital output data 12 after completion of the A/D conversion, the output data 12 is shifted by one clock (to the right) as shown in FIG. 2B and data 14 obtained by subtracting output data 13 of FIG. 2B from the output data 12 in FIG. 2C becomes as shown in FIG. 2C. It will be understood from the data 14 that the value on the (+) side of the amplitude of the portion corresponding to the glitch noise and that on the (−) side coincide.

As mentioned above, by obtaining a difference between the digital output data after the A/D conversion and the data obtained by shifting the digital output data by one clock, the glitch noise can be detected, the amplitude can be known, and its feature (for example, generating position or the like on the relevant bit) can be known.

Figure 3:
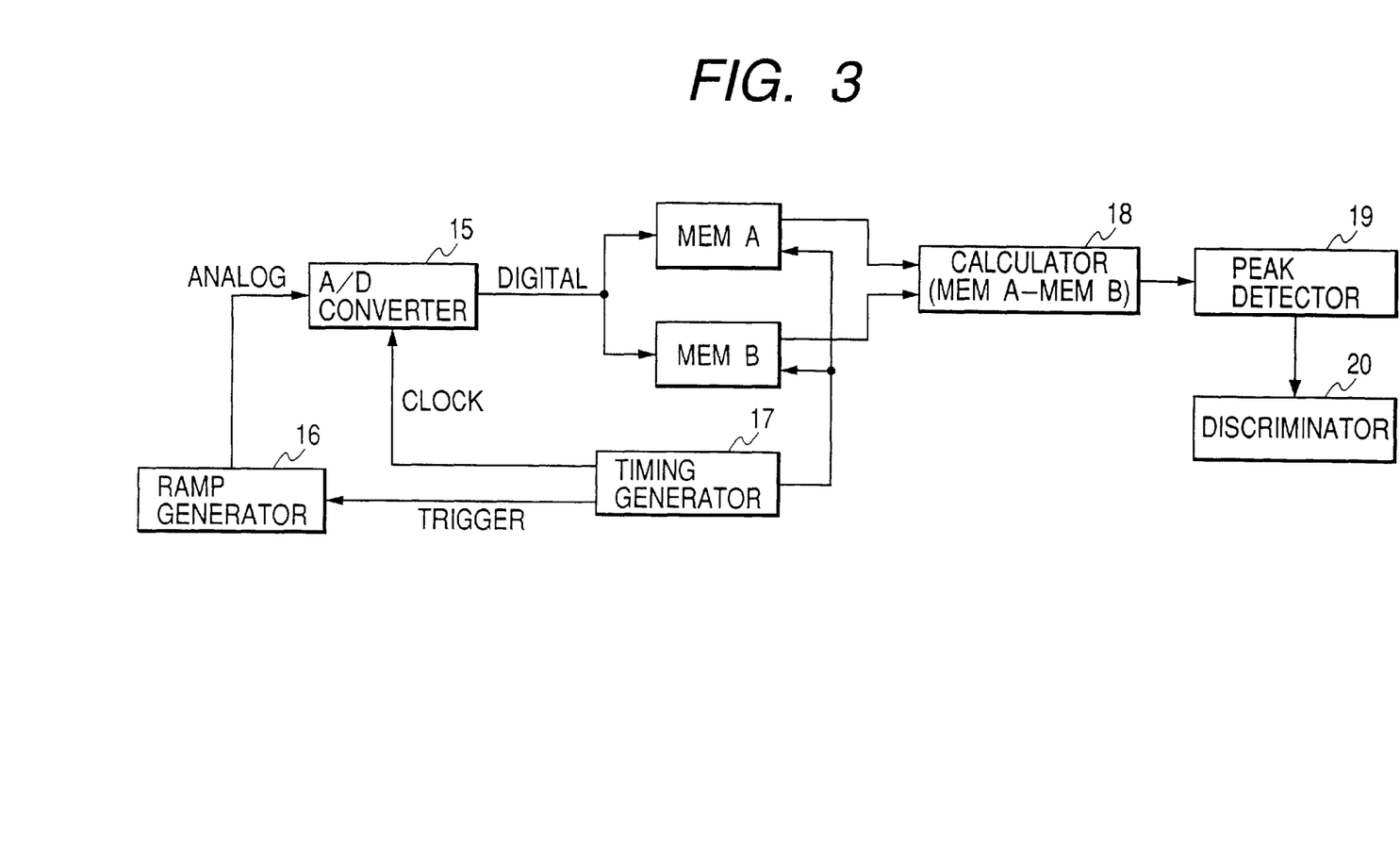
FIG. 3 is a block diagram of a testing circuit of a glitch noise according to the invention.

FIG. 3 is a block diagram of the first embodiment. As shown in FIG. 3, reference numeral 15 denotes an A/D converter to be tested; 16 a ramp generator; and 17 a timing generator. In response to an input of a trigger signal from the timing generator 17, the ramp generator 16 inputs a signal having a ramp waveform to the A/D converter 15. In response to a clock signal from the timing generator 17, the A/D converter 15 executes an A/D conversion of the inputted signal of the ramp waveform and stores digital output data into memories A and B. Subsequently, in response to a clock signal from the timing generator 17, the storage data is read out from each of the memories A and B while delaying a phase of the data in the memory B by a time corresponding to one clock from the data in the memory A. In a calculator 18, the read-out data of the memory B is subtracted from the read-out data of the memory A and a peak value of a subtraction value is detected by a peak detector 19. If the peak value lies within a range of ±1, a discriminator 20 determines that no glitch noise occurs. When the peak value exceeds the range of ±1, since this means that the glitch noise has occurred, the discriminator 20 decides that there is a defect.

Figure 4:
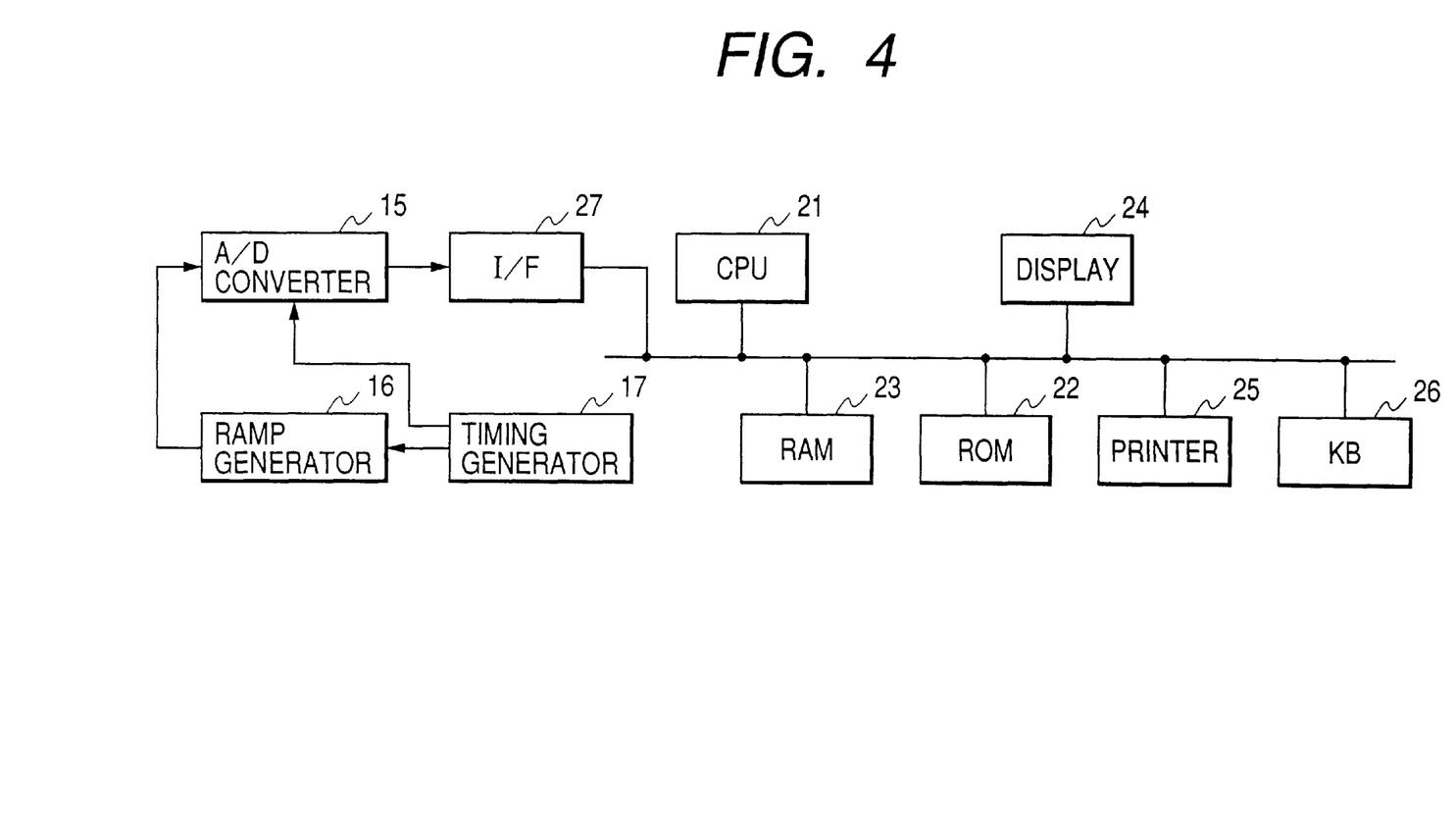
FIG. 4 is a block diagram of another testing circuit of a glitch noise according to the invention.
Figure 5:
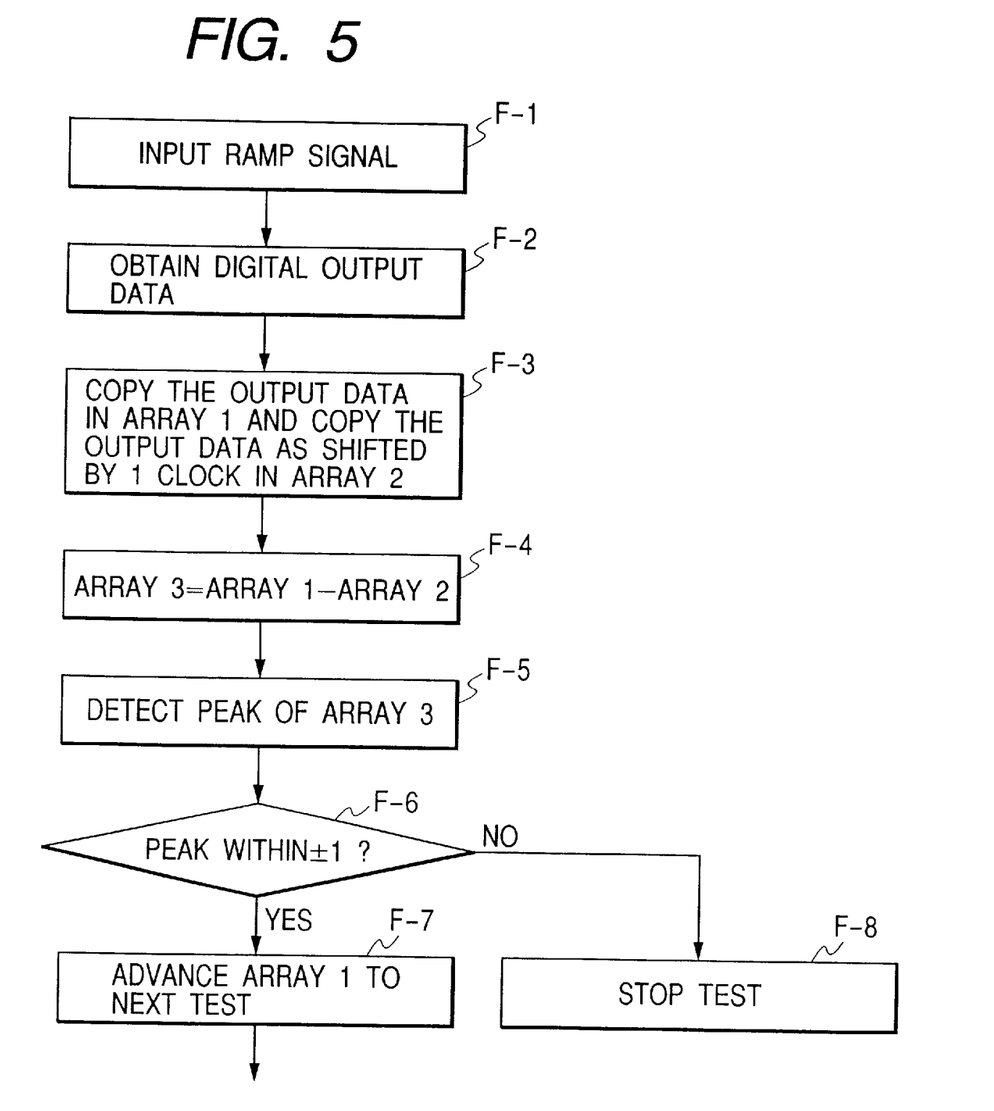
FIG. 5 is a flowchart showing an operation procedure of the testing method of a glitch noise according to the invention.

FIG. 4 is a block diagram of the second embodiment. As shown in FIG. 4, reference numeral 21 denotes a CPU for executing a control procedure as shown in FIG. 5 in accordance with a program stored in an ROM 22. Reference numeral 23 denotes an RAM having a work area of the CPU 21; 24 a display for displaying a result or the like of a test, which will be explained hereinlater; 25 a printer for printing the result or the like of the test, which will be explained hereinlater; 26 a keyboard for inputting an instruction or the like to the CPU 21; and 27 an interface for inputting output data from the A/D converter 15.

A testing method of the second embodiment will now be described with reference to FIG. 5. First, in response to the input of a trigger signal from the timing generator 17, the signal having the ramp waveform is inputted to the A/D converter 15 (step F-1). In response to a clock signal from the timing generator 17, the A/D converter 15 executes an A/D conversion of the inputted signal of the ramp waveform and fetches an obtained digital output data through the interface 27 (F-2). The output data is stored (copied) into an arbitrary array 1 on the RAM 23 and the output data is similarly copied into an arbitrary array 2 in a form in which a phase is shifted by one clock (F-3). Subsequently, data obtained by subtracting the array 2 from the array 1 is stored into an arbitrary array 3 (F-4). A peak value of the array 3 is detected (F-5). A check is made to see if the peak value lies within a range of ±1 (F-6). If the peak value lies within the range of ±1, since this means that no glitch noise is generated, the data of the array 1 is extracted and a next test of the histogram method or the like is executed (F-7). When the peak value exceeds the range of +1, since this means that the glitch noise has occurred, it is decided that a defect has occurred, and the testing operation is stopped (F-8).

In the embodiment, although the program has been stored in the ROM, a program stored in a floppy disk, a CD-ROM, or the like can be also installed to an RAM or a hard disk.

The present invention is not limited to the foregoing embodiments but many modifications and variations are possible within the spirit and scope of the appended claims of the invention.

What is claimed is:

1. A method of testing an A/D converter for glitch noise, comprising the steps of:

inputting an analog signal into an A/D converter;

storing first and second digital output codes outputted from the A/D converter in first and second memory areas, respectively, each of the first and second digital output codes comprising data elements, the second digital output code shifted from the first digital output code by a predetermined amount;

obtaining, data element by data element, a difference between one of the data elements of the first digital output code stored in the first memory area and a corresponding one of the data elements of the second digital output code stored in the second memory area; and determining a quality of the A/D converter for detecting a glitch based on whether a peak value of the difference obtained in said obtaining step is in a predetermined range.

2. A method according to claim 1, wherein the predetermined amount is one clock.

3. A method according to claim 1, wherein when the peak value of the difference exceeds a range of ±1, said determining step determines that a glitch has occurred.

4. A method according to claim 3, wherein each of the digital output codes is comprised of one or more bits and when a value on a plus (+) side of an amplitude of the peak value of the difference exceeding the range of ±1 and a value on a minus (−) side of the amplitude do not coincide, said determining step determines that glitch noise has occurred at a change position of a relevant bit of the digital output code, and when the plus (+) side and the minus (−) side values coincide, said determining step determines that glitch noise has occurred in a flat portion of the relevant bit of the digital output code.

5. A method according to claim 1, further comprising the step of recognizing converting characteristics of the A/D converter on the basis of the digital output code outputted from the A/D converter.

6. A testing apparatus for testing an A/D converter for glitch noise, comprising:

signal generation means for generating an analog signal;

input means for inputting the analog signal generated by said signal generating means to the A/D converter;

memory means for storing first and second digital output codes from the A/D converter in first and second memory areas, respectively, each of the first and second digital output codes comprising data elements, the second digital output code shifted from the first digital output code by a predetermined amount;

deriving means for deriving, data element by data element, a difference between one of the data elements of the first digital output code stored in the first memory area and a corresponding one of the data elements of the second digital output code stored in the second memory area;

detecting means for detecting a glitch based on a peak value of the difference derived by said deriving means; and timing generation means for generating a timing for generating the analog signal by said signal generation means, a timing operation for the A/D converter, and a timing for shifting the digital output data by the predetermined clocks.

7. An apparatus according to claim 6, wherein the A/D converter converts the analog signal into digital data synchronously with the shifting of the second digital output code.

8. An apparatus according to claim 6, wherein when the peak value of the difference exceeds a range of ±1, said detecting means detects a glitch.

9. An apparatus according to claim 6, wherein each of the digital output codes is comprised of one or more bits and when a value on a plus (+) side of an amplitude of the peak value of the difference exceeding a range of ±1 and a value on a minus (−) side of the amplitude do not coincide, said detecting means detects glitch noise at a change position of a relevant bit of output code, and when the plus (+) side and the minus (−) side values coincide, said detecting means detects glitch noise in a flat portion of the relevant bit of the digital output code.

10. An apparatus according to claim 6, further comprising recognizing means for recognizing converting characteristics of the A/D converter on the basis of the digital output code outputted from the A/D converter.

11. A computer-readable storage medium which stores a program to test an A/D converter having an input signal of ramp waveform, said program causing a computer to execute the steps of:

storing first and second digital output data from the A/D converter in first and second memory areas, respectively, each of the first and second digital output data comprising data elements, the second digital output data shifted from the first digital output data by a predetermined amount;

obtaining, data element by data element, a difference between one of the data elements of the first digital output data stored in the first memory area and a corresponding one of the data elements of the second digital output data stored in the second memory area; and determining a quality of the A/D converter for glitch noise, the A/D converted based on whether a peak value of the difference obtained in said obtaining step in a predetermined range.

12. A medium according to claim 11, wherein the predetermined amount is one clock.

13. A medium according to claim 11, wherein when the peak value of the difference exceeds a range of ±1, said determining step determines that the glitch has occurred.

14. A medium according to claim 13, wherein each of the digital output codes is comprised of one or more bits and when a value on a plus (+) size of an amplitude of the peak value of the difference exceeding the range of ±1 and a value on a minus (−) side do not coincide, said determining step determines glitch noise has occurred at a change position of a relevant bit of output code, and when the plus (+) side and the minus (−) side values coincide, said determining step determines glitch noise has occurred in a flat portion of the relevant bit of the digital output code.

15. A medium according to claim 11, wherein said program further causes the computer to execute the step of recognizing converting characteristics of the A/D converter on the basis of the digital output data outputted from the A/D converter.

* * * * *

UNITED STATES PATENT AND TRADEMARK OFFICE
CERTIFICATE OF CORRECTION

PATENT NO. : 6,549,573 B2
DATED : April 15, 2003
INVENTOR(S) : Takahashi

It is certified that error appears in the above-identified patent and that said Letters Patent is hereby corrected as shown below:

Column 2,
Line 55, "another" should read -- other --.

Column 6,
Line 12, "convertor" should read -- converter for glitch noise, the AD converter --.
Line 27, "quality of the A/D converter for glitch" should read -- quality of the A/D convertor --.
Line 28, "noise, the A/D converted based" should read -- based --.
Line 29, "step" should read -- step is --.
Line 38, "size" should read -- side --.

Signed and Sealed this

Twenty-third Day of December, 2003

JAMES E. ROGAN
*Director of the United States Patent and Trademark Office*